United States Patent
RaghuRam et al.

(10) Patent No.: US 7,375,971 B2
(45) Date of Patent: May 20, 2008

(54) MEMORY MODULE WITH AN ELECTRONIC PRINTED CIRCUIT BOARD AND A PLURALITY OF SEMICONDUCTOR CHIPS OF THE SAME TYPE

(75) Inventors: Siva RaghuRam, Germering (DE); Josef Schuster, Munich (DE); Simon Muff, Mering (DE); Abdallah Bacha, Munich (DE)

(73) Assignee: Infineon Technologies AG, Munich (DE)

( * ) Notice: Subject to any disclaimer, the term of this patent is extended or adjusted under 35 U.S.C. 154(b) by 187 days.

(21) Appl. No.: 11/437,846

(22) Filed: May 19, 2006

(65) Prior Publication Data
US 2007/0091704 A1 Apr. 26, 2007

(30) Foreign Application Priority Data
Oct. 26, 2005 (DE) ...................... 10 2005 051 497

(51) Int. Cl.
H05K 7/02 (2006.01)
(52) U.S. Cl. ...................... 361/736; 361/760; 361/748; 174/260; 365/51; 365/63; 257/678; 257/723
(58) Field of Classification Search ................ 361/736, 361/748, 760, 764, 783, 803; 174/260; 365/51, 365/63; 257/678, 723
See application file for complete search history.

(56) References Cited

U.S. PATENT DOCUMENTS 5,270,964 A * 12/1993 Bechtolsheim et al. ....... 365/52
(Continued)

FOREIGN PATENT DOCUMENTS
DE 201 08 758 U1 9/2001
DE 10 2004 021 226 A1 11/2005

*Primary Examiner*—Tuan T. Dinh
*Assistant Examiner*—Dameon E Levi
(74) *Attorney, Agent, or Firm*—Slater & Matsil, L.L.P.

(57) ABSTRACT

In a first embodiment, the invention provides a memory module having an electronic printed circuit board and a plurality of semiconductor chips of the same type that are mounted on at least one outer face of the printed circuit board. The printed circuit board has a connector strip, which runs at a first edge of the at least one outer face in a first direction and has a multiplicity of electrical contacts that are lined up in the first direction. The printed circuit board extends in the first direction between two opposite second edges. At least nine of the semiconductor chips of the same type are respectively mounted next to one another on the outer face of the printed circuit board between the center of the printed circuit board and the respective second edge of the printed circuit board. The semiconductor chips of the same type respectively have a smaller dimension and, in the direction perpendicular to the smaller dimension, a larger dimension that is larger than the smaller dimension. A respective first group of four of the semiconductor chips of the same type, which are oriented so as to have their shorter dimension parallel to the connector strip, is arranged at the respective second edge of the printed circuit board. A second group of five semiconductor chips of the same type is respectively arranged between the first group of semiconductor chips and the center of the printed circuit board. The first group of semiconductor chips and the second group of semiconductor chips are actuated by two separate line buses whose conductor tracks branch toward all the semiconductor chips in the respective group of semiconductor chips.

29 Claims, 5 Drawing Sheets

U.S. PATENT DOCUMENTS

| | | | |
|---|---|---|---|
| 5,272,664 A * | 12/1993 | Alexander et al. ............. 365/52 |
| 5,383,148 A * | 1/1995 | Testa et al. .................... 365/52 |
| 5,532,954 A * | 7/1996 | Bechtolsheim et al. ....... 365/52 |
| 5,973,951 A * | 10/1999 | Bechtolsheim et al. ....... 365/52 |
| 6,169,325 B1 * | 1/2001 | Azuma et al. ............... 257/685 |
| 6,414,868 B1 * | 7/2002 | Wong et al. ................... 365/51 |
| 6,714,433 B2 * | 3/2004 | Doblar et al. ................. 365/63 |
| 6,751,113 B2 * | 6/2004 | Bhakta et al. ................. 365/63 |
| 6,873,534 B2 * | 3/2005 | Bhakta et al. ................. 365/63 |
| 6,930,903 B2 * | 8/2005 | Bhakta et al. ................. 365/63 |
| 7,315,454 B2 * | 1/2008 | Schuster ...................... 361/736 |
| 2002/0196612 A1 | 12/2002 | Gall et al. |
| 2003/0116835 A1 * | 6/2003 | Miyamoto et al. .......... 257/678 |

* cited by examiner

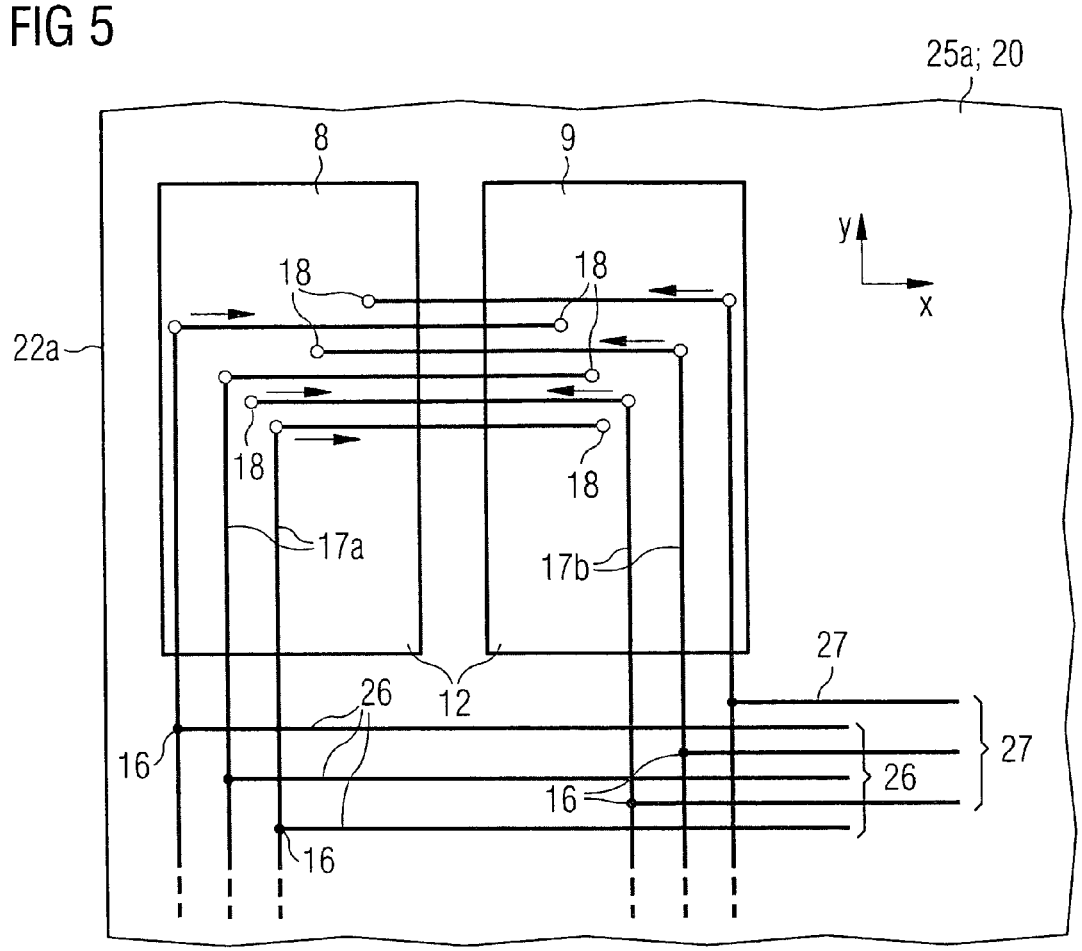

MEMORY MODULE WITH AN ELECTRONIC PRINTED CIRCUIT BOARD AND A PLURALITY OF SEMICONDUCTOR CHIPS OF THE SAME TYPE

This application claims priority to German Patent Application 10 2005 051 497.9, which was filed Oct. 26, 2005, and is incorporated herein by reference.

TECHNICAL FIELD

The invention relates to a memory module having an electronic printed circuit board and a multiplicity of semiconductor chips of the same type that are mounted on at least one outer face of the printed circuit board.

BACKGROUND

Memory modules are used for simultaneously actuating a plurality of semiconductor chips, for example DRAMs (dynamic random access memories), which are operated in parallel with one another and, therefore, all receive electrical signals at the same time. To distribute the electrical signals, an electronic printed circuit board is used that has chip contact connections and a connector strip that is used to connect the printed circuit board to a superordinate electronic unit, for example to a mother board. The connector strip may be formed on one or two outer faces of the printed circuit board and has a respective multiplicity of contact connections that are lined up in a first direction along a first edge of the printed circuit board.

Conductor tracks on or in the printed circuit board run between the contacts of the connector strip and the chip contact connections and also further components, such as registers, PLLs (phased-locked loops), etc. Normally, the conductor tracks in today's memory modules are formed on a plurality of planes within a multicomponent electronic printed circuit board. The conductor tracks may respectively run within a conductor plane on the printed circuit board or may run in sections over various conductor track planes that are connected to one another by appropriate electrically conductive contact-hole fillers.

The storage capacity of today's memory modules is increasingly large, since firstly the storage capacity of the semiconductor chips themselves is becoming ever larger and secondly an increasingly large number of semiconductor chips is being mounted on a printed circuit board. In this case, the area of the printed circuit board must not be increased if at all possible or at most slightly.

Many memory modules have electronic printed circuit boards that are fitted with DRAMs or other semiconductor memories of the same type as one another frequently in mirror-image symmetrical form relative to the center of the connector strip and hence in mirror-image symmetrical form relative to the center of the memory module. By way of example, it is possible for nine respective semiconductor chips of the same type to be mounted next to one another between the center of the memory module and a respective second edge of the printed circuit board that runs in a second direction perpendicular to the connector strip. Eight of the semiconductor chips on each half of an outer face of the printed circuit board are used to store the actual storage data, whereas a ninth semiconductor chip is used as an ECC (error correcting code) chip, which prevents storage errors or reading errors by comparing the signals from the remaining eight memory chips.

When, by way of example, nine semiconductor chips of the same type are arranged per half of the outer face of the printed circuit board (for example in each case on both halves of the front of the printed circuit board), the problem is to find an arrangement of memory chips that is compatible with the demand for the most uniform possible signal propagation times to all the semiconductor chips and the most equal possible conductor track lengths. Added to this is the desire to manage as far as possible without any signal drivers along the conductor tracks, as these would take up additional space on the conductor track.

SUMMARY OF THE INVENTION

In one aspect, the present invention provides a memory module that allows the most interference-free possible actuation of all semiconductor chips in the memory module. In particular, all the semiconductor chips in the memory module are intended to be able to be actuated such that as few signal propagation time differences as possible arise, which make it more difficult to actuate a plurality of semiconductor chips simultaneously or necessitate additional driver elements. In another aspect, the invention provides a memory module in which non-square semiconductor chips are arranged such that, despite their geometry and their arrangement in different regions of the printed circuit board area, they allow the simplest possible actuation.

In a first embodiment, the invention provides a memory module having an electronic printed circuit board and a plurality of semiconductor chips of the same type that are mounted on at least one outer face of the printed circuit board. The printed circuit board has a connector strip, which runs at a first edge of the at least one outer face in a first direction and has a multiplicity of electrical contacts that are lined up in the first direction. The printed circuit board extends in the first direction between two opposite second edges. At least nine of the semiconductor chips of the same type are respectively mounted next to one another on the outer face of the printed circuit board between the center of the printed circuit board and the respective second edge of the printed circuit board. The semiconductor chips of the same type respectively have a smaller dimension and, in the direction perpendicular to the smaller dimension, a larger dimension that is larger than the smaller dimension. A respective first group of four of the semiconductor chips of the same type, which are oriented so as to have their shorter dimension parallel to the connector strip, is arranged at the respective second edge of the printed circuit board. A second group of five semiconductor chips of the same type is respectively arranged between the first group of semiconductor chips and the center of the printed circuit board. The first group of semiconductor chips and the second group of semiconductor chips are actuated by two separate line buses whose conductor tracks branch toward all the semiconductor chips in the respective group of semiconductor chips.

In some embodiments, a memory module has a specific arrangement of rectangular, non-square semiconductor chips that are arranged and connected by conductor tracks such that they can be actuated without significant signal propagation time fluctuations. The invention provides for at least one outer face of the electronic printed circuit board to have at least nine semiconductor chips provided on it that are arranged between an edge of the printed circuit board and the center of the printed circuit board. A further nine semiconductor chips of the same design may be arranged on the far side of the center of the printed circuit board, that is to say between the center of the printed circuit board and the opposite edge of the printed circuit board on the same outer face of the printed circuit board. This results in eighteen positions for semiconductor chips, which are of the same design as one another and are arranged next to one another on at least one side of the printed circuit board, the positions of nine semiconductor chips of the same design being able to be mirror-inverted in relation to the positions of the further nine semiconductor chips of the same design. In this case, the axis of symmetry may run in the center between the two opposite edges and in the center thereof parallel to them. The axis of symmetry is then at approximately the same distance from the two opposite edges. There are, therefore, nine respective semiconductor chips arranged on the two half-sides of the at least one outer face (for example, in plan view onto the outer face, on the left and/or right of the center between the two opposite edges).

In line with the invention, these nine respective semiconductor chips are not arranged and actuated, as in the case of conventional memory modules, by a single line bus whose lines branch toward all nine respective semiconductor chips. Instead, the invention provides for two different line buses to be provided for the nine respective semiconductor chips, with one line bus making contact with four of the nine respective semiconductor chips and the other line bus making contact with five of the nine semiconductor chips. The invention also provides for the four semiconductor chips actuated by a common line bus to be arranged close to one of the edges of the printed circuit board, whereas the five semiconductor chips actuated jointly by the further line bus are arranged close to the center of the printed circuit board.

This inventive association between the semiconductor chips and the various line buses provides compensation for signal corruptions as a result of signal propagation times of different length, which arise when a line bus coming from the center of the printed circuit board, for example, is intended to make contact with semiconductor chips that are arranged at a greater or lesser distance from the input end of the line bus. Along each printed circuit board, signal delays and attenuations in the electrical pulses arise, which result from nonreactive resistances in the conductor tracks and increase as the conductor track length increases, for example.

The fact that the described embodiment involves the five semiconductor chips jointly actuated by a single line bus per half-area of the printed circuit board being arranged closer to the center of the printed circuit board than the other four semiconductor chips, which are actuated among one another by the other line bus but are arranged closer to the respective edge of the printed circuit board, achieves compensation between those signal changes that arise in one line bus as a result of the greater conductor track length and in the other line bus as a result of the greater number of connected semiconductor chips. A first line bus makes contact with just four semiconductor chips, which are, therefore, arranged closer to one edge of the printed circuit board (at a relatively great distance from the center of the printed circuit board and from the center of the connector strip). By contrast, a second line bus makes contact with a larger number of semiconductor chips (namely with five semiconductor chips instead of just four), and, therefore, has shorter conductor track lengths. This achieves a certain compensation for the signal corruptions on both line buses. In addition, signal corruptions on account of increased conductor track length and those on account of an increased number of connected semiconductor chips are prevented from adding up in one of the line buses. If, by way of example, a first line bus (of a first group of four semiconductor chips) has longer lines than a second line bus (of a second group of five semiconductor chips), this means a certain level of compensation for the upper limits, which are to be expected for possible signal distortions, since the first line bus, formed from the longer lines, only has to deal with a capacitive load of just four semiconductor chips (instead of five semiconductor chips as in the case of the second line bus).

Embodiments of the invention are, therefore, based on the idea of splitting the line bus for actuating a plurality of semiconductor chips of the same type such that despite an asymmetrical number of semiconductor chips per half-side of the printed circuit board the signal corruptions that arise turn out to be as small and standard as possible for all respective jointly connected semiconductor chips. Particularly with regard to the circumstance that the length of an electronic printed circuit board in a memory module along its connector strip, which prescribes a first direction, for example, is considerably greater than the width of the printed circuit board in a second lateral direction, in which the outer edges opposite one another run, the inventive actuation of the semiconductor chips by a plurality of line buses of different arrangement and design has a very advantageous effect on the operational reliability of the inventive memory module.

Preferably, the first group of semiconductor chips has a first pair of semiconductor chips, which is arranged in proximity to the connector strip, and a second pair of semiconductor chips, which are arranged at a greater distance from the connector strip than the semiconductor chips in the first pair, where one respective semiconductor chip in each pair is arranged at the second edge of the printed circuit board, and the respective other semiconductor chip in the respective pair is arranged at a greater distance from the relevant second edge of the printed circuit board. The four semiconductor chips in the first group are arranged in proximity to one of the two second edges of the printed circuit board that extend in a second direction from the edge provided with the connector strip. However, only two of the semiconductor chips in the first group are arranged in direct proximity to, that is to say at a relatively short distance from, this second edge; the other two semiconductor chips in the first group are arranged at a somewhat greater distance from this second edge. By way of example, the four semiconductor chips may be arranged in the form of a matrix comprising two times two semiconductor chips, for example, with a first pair of semiconductor chips being arranged relatively close to the connector strip and a second pair of semiconductor chips being arranged at a somewhat greater distance from the connector strip. This means that the printed circuit board area close to the two edges at the ends of the connector strip can be fitted with semiconductor chips in a space-saving manner.

Preferably, each conductor track in the line bus of the first group of semiconductor chips has a branch node that is arranged between the first pair and the second pair of semiconductor chips and from which two respective line branches emerge, which respectively make contact with the two semiconductor chips in one of the two pairs of semiconductor chips. In particular, the branch nodes in the lines in the line bus, which make contact with all four semiconductor chips, are arranged centrally between the two pairs of semiconductor chips on or in the printed circuit board, as a result of which standard signal propagation times to the first and second pairs of semiconductor chips are achieved. A respective line branch is connected to the semiconductor chips in the first pair and a respective other line branch is connected to the two semiconductor chips in the second pair of semiconductor chips.

Preferably, the line branches are respectively routed away below the base area of one semiconductor chip in the relevant pair and end in the region of the base area of the respective other semiconductor chip in the relevant pair. Each line branch is, therefore, used to actuate precisely two semiconductor chips, and it starts from the branch point below one semiconductor chip, makes contact with this semiconductor chip and finally ends at a contact connection in the region of the base area of the other semiconductor chip in the same pair of semiconductor chips. This removes the need for further branch nodes within the line branches. In addition, all the line branches may be produced in the same length within the group of four semiconductor chips.

Preferably, the line bus for the first group of semiconductor chips has at least one first conductor track whose branch node is arranged in the first direction in proximity to the two semiconductor chips arranged at the second edge of the printed circuit board and whose line branches end in the region of the base area of the two further semiconductor chips in the first group. That part of the conductor track that is situated in the line bus on the input side upstream of the branch node, therefore, extends as far as a section of the printed circuit board length, measured in the first direction, in which the two semiconductor chips closest to the second edge are arranged. From there, contact is first of all made with the two semiconductor chips situated at this second edge; the line branches then end at the two further semiconductor chips in the first group.

Similarly, there may also be provision for the line bus for the first group of semiconductor chips to have at least one second conductor track whose branch node is arranged in the first direction in proximity to the two further semiconductor chips in the first group and whose line branches respectively end in the region of the base area of the semiconductor chips arranged at the respective second edge. The branch node in this second conductor track is, therefore, closer to the center of the printed circuit board than the branch node in the first conductor track. Consequently, the line branches coming from the branch node in the second line first of all make contact with the semiconductor chips situated closer to the center and end below the semiconductor chips situated at the second edge.

Preferably, the line bus in the first group has at least one first conductor track and a second conductor track. In line with this development, the line bus in the first group of semiconductor chips is designed such that the first conductor track first of all makes contact with the two semiconductor chips situated at the second edge and ends at contact connections on the semiconductor chips situated further toward the center of the printed circuit board. In the case of the second conductor track, this is the other way round. The combination of first and second lines within the same line bus for the first group of four semiconductor chips allows signals from a plurality of branched conductor tracks to be electrically decoupled from one another as a result of signal directions in opposite senses along the lines, as described in more detail below.

Preferably, the line bus for the first group of semiconductor chips respectively has the same amount of first and second conductor tracks. If, by way of example, a first line bus comprising between 22 and 32 branched conductor tracks, for example a first line bus comprising 28 branched conductor tracks, is provided then it preferably contains fourteen first conductor tracks and fourteen second conductor tracks. By virtue of the line branches that come from the branch points engaging in one another in combed fashion, electrical decouplings are permitted, as described at a later point below, which would not be possible with greater concentration of the branch points at the same location on the printed circuit board area.

Preferably, provision may be made for all four semiconductor chips in the respective first group of semiconductor chips to be arranged so as to have their shorter dimension parallel to the connector strip and so as to have their longer dimension perpendicular to the connector strip, that is to say parallel to the second edges. As a result, more printed circuit board area remains for the greater number of five semiconductor chips on the same half-area of the printed circuit board.

Preferably, the second group of semiconductor chips respectively has a first semiconductor chip, a first pair of semiconductor chips and a second pair of semiconductor chips, where the first semiconductor chip and the two semiconductor chips in the second pair are respectively mounted so as to have their larger dimension oriented parallel to the connector strip, and the two semiconductor chips in the first pair are mounted so as to have their smaller dimension oriented parallel to the connector strip, where the semiconductor chips in the first pair are arranged at a greater distance from the contact strip than the first semiconductor chip and than the semiconductor chips in the second pair, and where the first semiconductor chip is arranged between the first group of semiconductor chips and the second pair of semiconductor chips in the second group.

Although at first glance this inventive arrangement of semiconductor chips in the second group reveals no standard orientation or standard positioning of these five semiconductor chips, this arrangement allows actuation through branched lines of a further line bus, with only minimal relative signal delays and signal attenuations occurring within the line bus in the second group of semiconductor chips. In this respect, the first semiconductor chip in the second group of semiconductor chips adopts a special position when its position approximately indicates the region on the printed circuit board area where the branch nodes in the conductor tracks are arranged and from where line branches extend to the further four semiconductor chips in the second group, which are respectively arranged in pairs.

The region of the base area of the first semiconductor chip in the second group of semiconductor chips thus corresponds to the region up to which all conductor tracks in the line bus of the second group of semiconductor chips run before they branch to the individual semiconductor chips in the second group.

Preferably, the respective two semiconductor chips in the first pair in the first group, in the second pair in the first group and in the first pair in the second group of semiconductor chips are respectively mounted so as to be at a distance from one another in the first direction, and the two semiconductor chips in the second pair in the second group of semiconductor chips are mounted so as to be at a distance from one another in the direction perpendicular to the first direction. The two semiconductor chips in the second pair in the second group are, therefore, arranged next to one another in the direction that is prescribed by the main direction of extent of the connector strip, whereas the respective two semiconductor chips in the remaining pairs of semiconductor chips are respectively arranged in the direction perpendicular to the course of the connector strip next to one another at a certain distance. Preferably, the semiconductor chips in all the pairs in the first and second groups are, therefore, arranged such that the two semiconductor chips in each pair have their larger dimension respectively facing one another. This allows the semiconductor chips to be arranged compactly on the printed circuit board area.

Preferably, the conductor tracks in the line bus in the second group of semiconductor chips respectively have a branch node in the region of the base area of the first semiconductor chip in the second group, from which branch node the first semiconductor chip has contact made with it and from which branch node two respective line branches emerge, with one line branch making contact with the two semiconductor chips in the first pair and the other line branch making contact with the two semiconductor chips in the second pair. In line with this advantageous development, the semiconductor chips in the second group, which are respectively arranged in pairs, are respectively actuated by line branches that make contact with two respective semiconductor chips in similar fashion to the line branches in the line bus of the first group of semiconductor chips. By contrast, the first semiconductor chip in the second group of semiconductor chips has no contact made with it by these line branches; instead, contact is made with it either directly at the location of the respective branch node or by way of a dedicated shorter line branch that is routed only to the contact connection on the first semiconductor chip in the second group and may be used to compensate for signal propagation times and conductor track lengths in the remaining line branches. The first and second pairs of semiconductor chips in the second group, therefore, respectively represent pairs of semiconductor chips that respectively have contact made with them jointly by line branches in the branched conductor tracks.

Preferably, the first pair and the second pair of semiconductor chips from the second group of semiconductor chips respectively have a first semiconductor chip and a second semiconductor chip, where the first semiconductor chip in the first pair is arranged at a greater distance from the center of the memory module than the second semiconductor chip in the first pair, and where the first semiconductor chip in the second pair is arranged closer to the connector strip than the second semiconductor chip in the second pair. In line with this embodiment, the first semiconductor chip in the second pair is arranged more closely to the connector strip. The first semiconductor chip in the second pair is arranged further away from the center of the memory module than the respective second semiconductor chip in the relevant pair. This no longer means that the semiconductor chips in the first pair are mounted so as to have their smaller dimension oriented parallel to the connector strip and the semiconductor chips in the second pair in the second group are mounted so as to have their larger dimension oriented parallel to the connector strip, but rather likewise means that all four semiconductor chips in the two pairs of semiconductor chips in the second group have their shorter dimension facing the first semiconductor chip in the second group of semiconductor chips. The four semiconductor chips in the first and second pairs in the second group are, therefore, all situated in direct proximity to the first semiconductor chip in the second group. Connecting up these four semiconductor chips in the second group in a star circuit from that subregion of the printed circuit board area, which is situated below the base area of the first semiconductor chip in the second group would be more difficult, on the other hand, if all or some of the semiconductor chips in the first and second pairs in the second group were to have their longer dimension facing the first semiconductor chip in the second group. The arrangement of the semiconductor chips in the second group in line with the developments cited above, therefore, allows short signal paths, which are also standard among one another, from the branch nodes in the conductor tracks to the semiconductor chips in the second group, which are arranged in pairs.

Preferably, the line bus in the second group of semiconductor chips has at least one first conductor track from whose branch node two line branches emerge, one line branch of which makes contact with the two semiconductor chips in the first pair, and the other line branch of which makes contact with the two semiconductor chips in the second pair, where the two line branches, starting from the branch node, first of all make contact with the first semiconductor chip in the relevant pair of semiconductor chips and end at contact connections on the second semiconductor chip in the relevant pair. Hence, in similar fashion to the semiconductor chips in the first group, the paired semiconductor chips in the second group can also have contact made with them jointly by line branches in the branched conductor tracks. The first line branch makes contact with the two semiconductor chips in the first pair and the second line branch makes contact with the two semiconductor chips in the second pair in the second group of semiconductor chips. In this arrangement of semiconductor chips, the first and second line branches can be chosen to be of the same length. In the case of the advantageous arrangement of semiconductor chips described above, this is possible for each of the plurality of branched conductor tracks in the line bus in the second group of semiconductor chips.

In the advantageous embodiment cited above, the first conductor track is distinguished in that its line branches first of all make contact with the first pair's semiconductor chip, which is arranged more closely to the edge of the printed circuit board, or with the second pair's semiconductor chip, which is arranged more closely to the connector strip, and then, as the line branches progress further, end at contact connections on the relevant pair's second semiconductor chips, which are arranged more closely to the center of the printed circuit board or further away from the connector strip.

Preferably, the line bus in the second group of semiconductor chips has at least one second conductor track from whose branch node two line branches emerge, one line branch of which makes contact with the two semiconductor chips in the first pair, and the other line branch of which makes contact with the two semiconductor chips in the second pair, where the two line branches, starting from the branch nodes, first of all make contact with the second semiconductor chip in the relevant pair of semiconductor chips and end at contact connections on the first semiconductor chip in the relevant pair. The second conductor track in the line bus of the second group of semiconductor chips, which conductor track is provided (preferably additionally) on the basis of this embodiment, therefore first of all makes contact with those semiconductor chips in the chip pairs at which the line branches in the first conductor track end, whereas the line branches in the second conductor track end at contact connections on those semiconductor chips with which contact is first of all made by the line branches in the first conductor track, that is to say are arranged more closely to the latter's branch point.

In line with one advantageous development, the line bus of the second group of semiconductor chips has at least one first conductor track and at least one second conductor track. In particular, the line bus of the second group of semiconductor chips respectively has the same amount of first conductor tracks and second conductor tracks. Hence, four of the five semiconductor chips in the second group can have contact made with them, in similar fashion to the four semiconductor chips in the first group, alternately by first and second conductor tracks, whose line branches are routed first of all via the first and second semiconductor chips in the relevant pairs and then end at the respective other semiconductor chips in the relevant pair. This interconnection from different sides by line branches that are arranged in the region of the base area of the first semiconductor chip in the second group makes it possible to avoid signal distortions, as described below, which would arise in the event of signals propagating in the same direction along parallel lines.

Preferably, the line branches in the first conductor tracks and in the second conductor tracks in the line bus of the first group of semiconductor chips are arranged, starting from their respective branch node as far as their ends of line, such that the line branches in the first conductor tracks run in opposite senses parallel to the line branches in the second conductor tracks between the two semiconductor chips in the relevant pair of semiconductor chips in the first group. In the region between the two semiconductor chips in the first or second pair, the larger dimensions of the two semiconductor chips involved respectively face one another. In the direction perpendicular to the edges that have this larger dimension, the line branches in the first and second conductor tracks in the line bus of the first group of semiconductor chips run on or in the printed circuit board at that point. As a result of the line branches in the first conductor tracks— measured in the direction of the respective branch point as far as the chip end of line—running in opposite senses parallel to the line branches in the second conductor track in the region between the respective two semiconductor chips in a pair, signals that are sent to the semiconductor chips simultaneously via the first and second conductor tracks are routed along the first and second conductor tracks in opposite physical directions. Particularly when, with a large number of first and second conductor tracks, a respective line branch in a first conductor track follows a line branch in a second conductor track, and vice versa, only line branches that forward signals running parallel in opposite directions to one another in the region between the two semiconductor chips in the relevant pair are directly adjacent to one another. Interference from electrical signals that are propagating along line branches that are directly adjacent to one another is, therefore, practically excluded.

Preferably, the line branches in the first conductor tracks in the line bus of the first group of semiconductor chips are arranged so as to engage in combed fashion with the line branches in the second conductor tracks in the line bus of the first group of semiconductor chips. The combed intermeshing arrangement of the outer end regions of the line branches on the chip, which converge together from opposite directions, therefore eliminates unwanted signal coupling or interaction through signals running in parallel in the same physical direction for all directly adjacent line branches.

Accordingly, for the line bus of the second group of semiconductor chips too, the line branches in the first conductor tracks and in the second conductor tracks in the line bus of the second group of semiconductor chips are preferably in a form, starting from their respective branch nodes as far as their ends of line, such that the line branches in the first conductor tracks run in opposite senses parallel to the line branches in the second conductor tracks between the two semiconductor chips in the relevant pair of semiconductor chips in the second group. In addition, the line branches in the first conductor tracks in the line bus of the second group of semiconductor chips are preferably arranged so as to engage in combed fashion with the line branches in the second conductor tracks in the line bus of the second group of semiconductor chips.

These two embodiments also preclude or at least significantly reduce signal interference from signals in two directly adjacent line branches for the semiconductor chips in the second group too.

Preferably, the memory module has at least eighteen semiconductor chips of the same type on the outer face of the printed circuit board between the two second edges, among which nine of the semiconductor chips of the same type are provided between the center of the memory module and one second edge and are arranged in mirror-inverted fashion relative to the center of the memory module in relation to a further nine of the semiconductor chips of the same type in the at least eighteen semiconductor chips of the same type that are arranged between the center of the memory module and the other second edge. In line with this embodiment, both halves of the at least one outer face of the printed circuit board are in mirror-image symmetrical form relative to one another in terms of the semiconductor chips fitted. This means that both the number of semiconductor chips on the left and right halves, for example, of the outer face of the printed circuit board is identical (particularly is precisely nine in each case) and the positions of the semiconductor chips are respectively mirror-image inverted relative to the center of the printed circuit board. However, this also means that the conductor tracks actuating the semiconductor chips in the printed circuit board run in approximately mirror-image inverted form relative to the center of the printed circuit board. This means that at least both in one half of the printed circuit board extending as far as a second edge and in the other half of the printed circuit board extending to the other second edge a respective first line bus is provided for a first group of precisely four semiconductor chips, which are all mounted in different positions next to one another on the printed circuit board, and that also both halves of the printed circuit board are provided with a respective further, second line bus for a second group of precisely five semiconductor chips in each case which are arranged at respective different positions on the printed circuit board area. The printed circuit board, therefore, has, on or below its outer face on which the eighteen semiconductor chips (all arranged at different positions) are arranged, two first line buses (close to a respective one of the second edges) and two second line buses (for respective groups of five semiconductor chips on both sides of the center of the printed circuit board), respectively.

In another development, the memory module has a front outer face and a back outer face, with the back outer face having at least a further eighteen semiconductor chips of the same type provided on it whose positions on the back outer face of the printed circuit board correspond to the positions of the semiconductor chips on the front outer face of the printed circuit board. In line with this embodiment, the memory module is provided with a printed circuit board, which has semiconductor chips fitted on both sides and which, as usual, is actuated using two connector strips on the two outer faces (DIMM; dual in-line memory module). In this case, the arrangement of at least the semiconductor chips (DRAMs), which are of the same design or of the same type as one another on the front of the memory module, is the same as on the back of the memory module.

In another embodiment, the memory module has further semiconductor chips of the same type, which are fitted on the semiconductor chips mounted on the printed circuit and are actuated via the same respective conductor tracks as the semiconductor chips mounted on the printed circuit board. In this embodiment, the semiconductor chips are not only mounted on a plurality of face regions of the printed circuit board area (on the front and/or back of the printed circuit board) directly on the printed circuit board, but rather are also stacked above one another, so that there are also further semiconductor chips arranged on the region of the base area of a semiconductor chip that is mounted on the printed circuit board, but at a greater distance from the printed circuit board. By way of example, two or four semiconductor chips stacked above one another may be fitted per outer side of the printed circuit board and per position within the printed circuit board area. Combined with the further features that the printed circuit board has components fitted on both sides and that eighteen respective different regions of the printed circuit board area are provided on each outer face of the printed circuit board and can have non-square semiconductor chips of the same design arranged on them next to one another, the printed circuit board of the inventive memory module can be fitted with 72 or 144 semiconductor chips of the same type, for example. The inventive actuation of the semiconductor chips by two separate line buses (possibly also in different forms) for a group of four and a group of five semiconductor chips (or positions within the printed circuit board area), respectively, per area half of each populated outer face of the printed circuit board allows the semiconductor chips to be connected up such that at most small relative signal delays between the line branches of the group's semiconductor chips jointly connected to the same branched conductor tracks arise within each line bus.

Preferably, the conductor tracks in the line buses, which make contact with the semiconductor chips, are control lines and address lines. The precise split of the plurality of conductor tracks per line bus into control lines and address lines can be varied arbitrarily. Preferably, however, both the control lines and the address lines in each line bus respectively contain first and second conductor tracks that engage in one another in combed fashion and hence largely preclude signal distortions when a plurality of semiconductor chips are actuated in parallel by control signals and address signals.

Preferably, the conductor tracks in each line bus of a first group of semiconductor chips respectively have an approximately standard length among one another, starting from an input end of the line bus as far as the respective ends of line connected to chip contact connections, and the conductor tracks in each line bus of a second group of semiconductor chips have a respective different standard length among one another, starting from an input end of the line bus as far as the respective ends of line connected to chip contact connections. Particularly for the respective four paired semiconductor chips in each first and second group of semiconductor chips, the length of the respective four line branches is standard. This reduces any relative propagation time fluctuations among the actuated semiconductor chips.

Preferably, the standard length of the conductor tracks in the first groups of semiconductor chips is greater than the standard length of the conductor tracks in the second groups of semiconductor chips. This is advantageous particularly when (but this must not necessarily be the case) the line buses run approximately from the center of the printed circuit board to the respective four or five semiconductor chips, because then the line buses in the first group of semiconductor chips have longer lines, but in return the lines in the line buses of the groups of five have to deal with a larger load of five (instead of four) connected semiconductor chips. This means a certain level of compensation for the upper limits, which are to be expected for possible signal distortions.

Preferably, the conductor tracks in the line buses respectively come from an input end of these line buses that is arranged approximately in the center between the two second edges of the memory module. Alternatively, the input ends of the line buses may also be arranged on the connector strip or may be arranged in any other region of the printed circuit board.

Preferably, the input ends of line of the conductor tracks are respectively connected to a register. A register of this type may be provided in order to safeguard the quality of the transmitted address and control signals and the simultaneous forwarding of these signals to all the semiconductor memories. However, the inventive memory module does not necessarily have to be a memory module buffered by a register (register-buffered memory module).

Preferably, the semiconductor chips of the same type are respectively dynamic read/write memory chips. Particularly DRAMs or other volatile semiconductor memories can be operated on a memory module of this type.

BRIEF DESCRIPTION OF THE DRAWINGS

The invention is described below with reference to the figures, in which:

FIG. 5 shows a further-enlarged detail view of the memory module from FIG. 2.

The following list of reference symbols can be used in conjunction with the figures:

| | |
|---|---|
| 1, . . . , 9; 1', . . . , 9' | Semiconductor chip |
| 10 | Memory module |
| 11 | First pair of semiconductor chips in the first group I |
| 12 | Second pair of semiconductor chips in the first group I |
| 13 | First pair of semiconductor chips in the second group II |
| 14 | Second pair of semiconductor chips in the second group II |
| 15 | Conductor track |
| 16; 16a, 16b | Branch node |
| 17; 17a, 17b | Line branch |
| 18 | Contact connection |
| 20 | Printed circuit board |
| 21 | First edge |
| 22; 22a, 22b | Second edge |
| 23 | Connector strip |
| 24 | Contact |
| 25; 25a, 25b | Outer face |
| 26 | First conductor track in the line bus L1 |
| 27 | Second conductor track in the line bus L1 |
| 30 | Center of the printed circuit board |
| 35 | Register |
| 36 | First conductor track in the line bus L2 |
| 37 | Second conductor track in the line bus L2 |
| 45 | Orientation marker |

-continued

| | |
|---|---|
| 46, 47 | Line branches in the second line bus L2 |
| 51, . . . , 59; 51', . . . , 59' | Back semiconductor chips |
| 60 | Stacked semiconductor chips |
| ADR | Address line |
| a | Smaller dimension |
| b | Larger dimension |
| CMD | Control line |
| E1 | Input end of the line bus |
| L1, L2 | Line bus |
| x | First direction |
| y | Second direction |
| I | First group of semiconductor chips |
| II | Second group of semiconductor chips |

DETAILED DESCRIPTION OF ILLUSTRATIVE EMBODIMENTS

Figure 1:
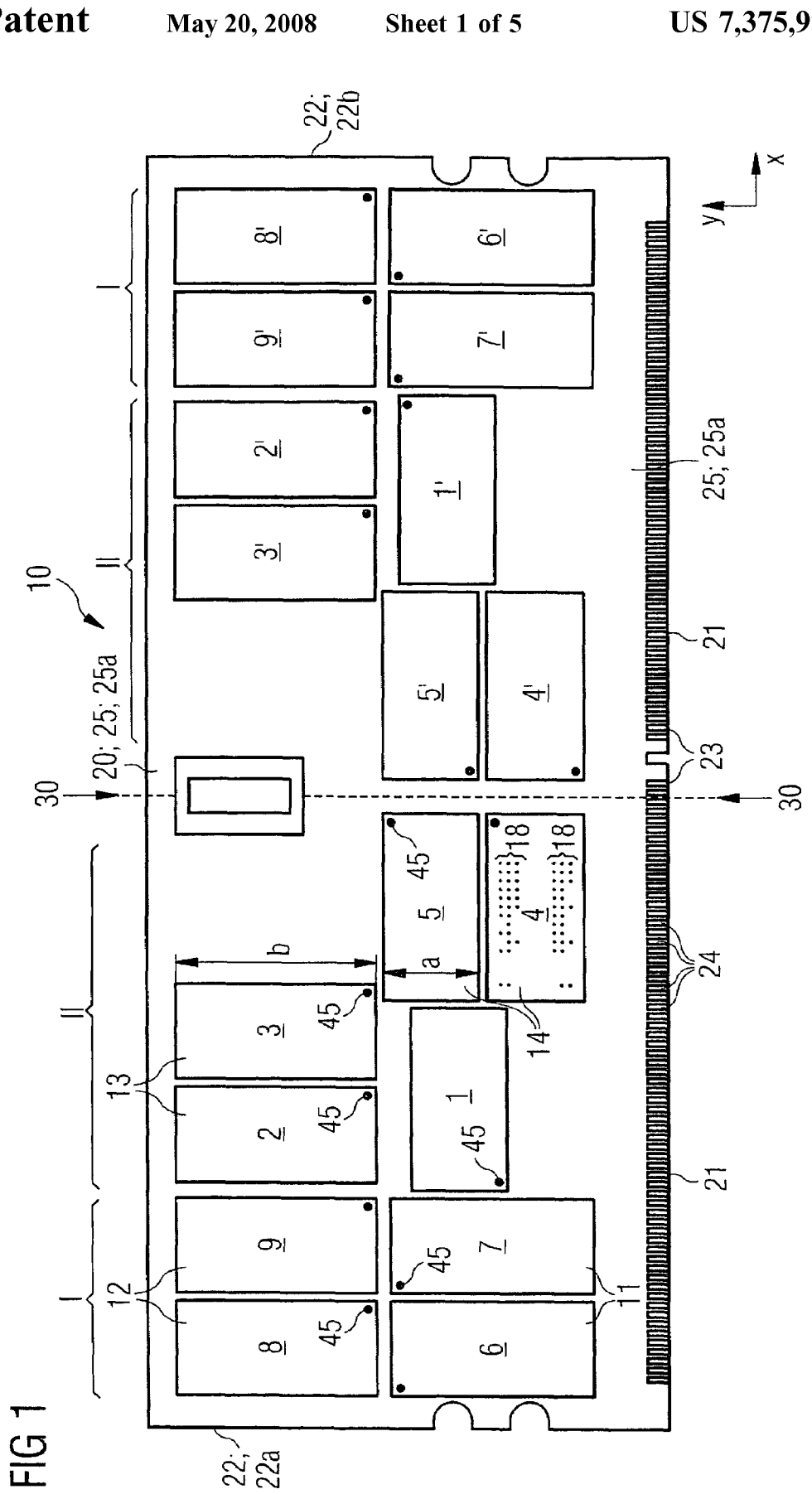
FIG. 1 shows a schematic plan view of a memory module based on the invention.

FIG. 1 shows a schematic plan view of the inventive memory module 10. It shows the plan view of an outer face 25, for example the front outer face 25i a of the electronic printed circuit board 20 of the memory module 10. The printed circuit board 20 has a connector strip 23 with a multiplicity of electrical contacts 24 which is arranged at a first edge 21 of the printed circuit board 20. The first edge 21 runs in a first direction x. In this direction, the printed circuit board 20 extends between two second edges 22, or 22a, 22b, which respectively run in a second direction y perpendicular to the first direction x. FIG. 1 shows the center 30 of the printed circuit board 20 between the two second edges 22a, 22b. Arranged between the center 30 of the printed circuit board 20 and a respective one of the two edges 22a; 22b are nine respective semiconductor chips 1, 2, . . . , 9 and 1', 2', . . . , 9' of the same design. All of these semiconductor chips of the same design are arranged in different subregions of the outer face 25 of the printed circuit board 20. Punctiform orientation markers 45 indicate how the semiconductor chips of the same design are arranged on the outer face 25 in an orientation relative to one another.

For the sake of simplicity, the text below refers exclusively to the semiconductor chips 1, 2, . . . , 9 shown in FIG. 1 on the left of the center 30 of the printed circuit board 20. However, the statements below apply in the same way to the semiconductor chips 1', 2', . . . , 9' arranged between the center 30 and the other second edge 22b.

The semiconductor chips 1, 2, . . . , 9 of the same design respectively have a smaller dimension a and a larger dimension b, which is larger than the smaller dimension a, in the lateral direction. The semiconductor chips, therefore, require a non-square base area on the outer face 25 of the printed circuit board 20. FIG. 1 reveals that the orientation of the semiconductor chips arranged next to one another in the inventive memory module 10 is not standard. In particular, it is also not standard in relation to that dimension which respectively runs parallel to the first direction or to the connector strip 23. In line with the invention, the semiconductor chips 1, 2, . . . , 9 are actuated by two separate line buses L1, L2 (FIG. 2), which will be discussed in more detail with reference to FIG. 2. These separate line buses respectively actuate a first group I (FIG. 1) of four semiconductor chips 6, 7, 8, 9 and also a second group of semiconductor chips 1, 2, 3, 4, 5. The input ends of the respective line buses for the group of four and the group of five semiconductor chips may be arranged in proximity to the center 30 of the printed circuit board 20, for example, but also on any other region of the printed circuit board or of its connector strip.

For the sake of simplicity, it is assumed below that the input ends of the line buses start approximately from the center 30 of the memory module 20; this simplifies illustration of the embodiment of the inventive memory module 10, which is shown only by way of example in FIGS. 1 and 2.

FIG. 1 shows that the first group I of semiconductor chips comprises two respective pairs 11, 12, with the two semiconductor chips 6, 7 in the first pair 11 in the first group I being arranged more closely to the connector strip 23 than those in the second pair 12. In addition, a respective first semiconductor chip 6; 8 in each pair 11, 12 is arranged at the edge 22; 22a or in proximity to this edge, whereas the respectively other, further semiconductor chip 7; 9 in a respective pair is arranged at a greater distance from this second edge 22; 22a.

The second group II of semiconductor chips comprises a first semiconductor chip 1, a first pair 13 of two semiconductor chips 2, 3 and a second pair 14 of two semiconductor chips 4, 5. The two semiconductor chips 2, 3 in the first pair 13, like the semiconductor chips 6, 7, 8, 9 in the first group I, are arranged so as to have their smaller dimension a parallel to the connector strip 23, whereas the remaining semiconductor chips 1, 4, 5 in the second group II are arranged so as to have their larger dimension b parallel to the connector strip 23.

Figure 2:
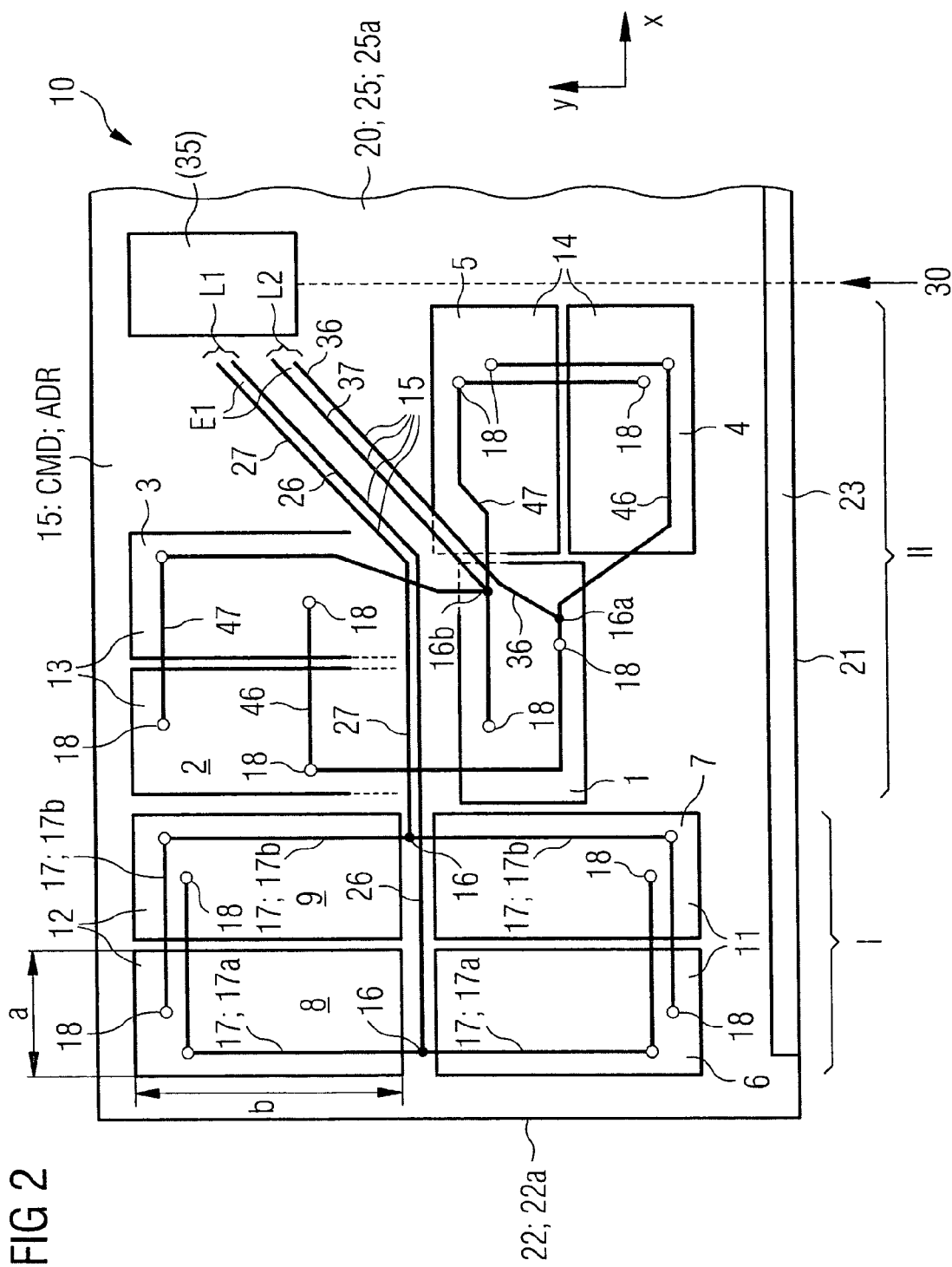
FIG. 2 shows an enlarged detail view of the memory module shown in FIG. 1 with an illustration of two separate line buses for actuating two groups of semiconductor chips.

In line with the invention, the five semiconductor chips in the second group II are actuated by a dedicated line bus L2 (FIG. 2), whereas the total of four semiconductor chips 6, 7, 8, 9 in the first group I, which are arranged next to one another, more closely to the second edge 22a, are actuated by another line bus L1 (FIG. 2). The invention, therefore, provides for the semiconductor chips arranged between the center 30 and the one first edge 22a to be actuated by two separate line buses, with that line bus that actuates the semiconductor chips arranged more closely to the edge 22a being connected to the smaller number of just four semiconductor chips. The semiconductor chips in the second group II, of which there are contrastingly a total of five, mean a higher load for the conductor tracks in the second line bus of the second group, but require shorter conductor track lengths in return. In addition, as explained below, the five semiconductor chips in the second group II are arranged such that upon actuation only small differences can arise in the respective signal propagation times. The conductor track profiles explained below with reference to FIG. 2 also apply in similar fashion to the semiconductor chips 1', 2', . . . , 9' shown in FIG. 1 on the right of the center 30.

FIG. 2 shows an enlarged detail view of the memory module 10 from FIG. 1. It shows essentially half of the printed circuit board 20, which extends between the center 30 of the printed circuit board 20 and one of the two second edges 22a. Arranged close to this edge is the first group I of four semiconductor chips 6, 7, 8, 9. The first group is coupled to a first line bus L1. In addition, the second group II of semiconductor chips 1, 2, 3, 4, 5 is arranged more closely to the center 30 of the printed circuit board 20 and is connected to a separate line bus L2. As FIG. 2 shows, each branching conductor track 15 makes contact exclusively with semiconductor chips in one of the two groups I; II. This inventive split makes it easier to connect up the semiconductor chips in less critical fashion for signal corruptions.

For the sake of clarity, the line buses L1, L2 shown in FIG. 2 are shown with just two conductor tracks 26, 27 and 36, 37, respectively. Each of these lines preferably represents a plurality of corresponding lines, however, which, in the same way as the respective line 26, 27, 36, 37 shown, branch to the individual semiconductor chips and make contact with them at appropriate contact connections 18. In this case, each semiconductor chip has a multiplicity of electrical contact connections 18, as shown by way of example for the semiconductor chip 4 in FIG. 1.

FIG. 2 shows a series of advantageous developments of the inventive memory module 10. It is thus possible to see that the conductor tracks 26, 27 in the first line bus L1 have circuit nodes 16, which are arranged between the first pair 11 and the second pair 12 of semiconductor chips and are, therefore, at approximately the same distance from both pairs. This allows the line branches 17 coming from the branch nodes 16 to be designed such that they are respectively of the same length. They extend from the respective branch node 16 via the contact connection 18 of one of the two respective connected semiconductor chips in a pair to the contact connection 18 on the other semiconductor chip in the respective pair. Thus, by way of example, the branch node 16 in a first conductor track 26 in the line bus L1 is arranged between the semiconductor chips 6, 8 situated at the second edge 22*a* and has two line branches 17*a*, which first of all make contact with these two semiconductor chips and end at the contact connections 18 of the two semiconductor chips 7, 9. In addition, a second conductor track 27 is shown whose circuit node 16 is arranged between the two semiconductor chips 7, 9 and whose line branches 17*b* end at contact connections 18 on the semiconductor chips 6, 8. The fact that at least a first conductor track 26 and a second conductor track 27, respectively, are arranged in the first line bus L1 means that it is possible to arrange the respective ends of the line branches 17*a*, 17*b* in both branched conductor tracks 26, 27 so as to converge with one another in the region between two respective semiconductor chips 6, 7 and 8, 9, respectively, in a corresponding pair 11; 12, coming from the opposite direction. During operation of the memory module, this has the advantage that the electrical signals that propagate along the line branches 17*a* and 17*b* run past one another in opposite directions, for example in a positive first direction or negative first direction x, and, therefore, do not result in significant signal corruptions even if the two line branches 17*a*, 17*b* are arranged very closely together in the region between the respective two semiconductor chips 6, 7 and 8, 9, respectively. Particularly if, as provided by way of preference, each of the two conductor tracks 16, 27 shown represents a plurality from a plurality of conductor tracks, particularly the same number thereof (for example 14), the respective line branches 17*a*, 17*b* can be arranged so as to engage in combed fashion in one another on or in the printed circuit board 20, so that despite a high density of conductor tracks any crosstalk from electrical signals along adjacent lines is virtually precluded.

FIG. 2 also shows that the line bus L2 for the second group II of semiconductor chips 1, 2, 3, 4, 5 has branch nodes 16*a*, 16*b*, which are arranged approximately in the region of the base area of the first semiconductor chip 1 in the second group II of semiconductor chips. The semiconductor chip 1 is the only one in the second group II that is not arranged as part of a pair of semiconductor chips. Preferably, the branch nodes 16*a*, 16*b* are, therefore, arranged in the region of the base area of this first semiconductor chip 1, in order to allow similarly symmetrical actuation of the remaining semiconductor chips in the second group II as in the line bus L1 for the first group I of semiconductor chips. To this end, the invention has the two semiconductor chips 2, 3 and two semiconductor chips 4, 5 arranged in respective pairs, so that the semiconductor chips in both pairs 13, 14 have their respective smaller dimension a facing the first semiconductor chip 1 in the second group II. This firstly allows shorter line paths from the branch points to the semiconductor chips 2, 3, 4, 5 and also allows a compact arrangement for these semiconductor chips on the printed circuit board 20. FIG. 2 shows that the line bus L2 has a first conductor track 36, whose branch node 16*a* is arranged on or very close to a contact connection 18 on the first semiconductor chip 1. From there, two line branches 46 extend, each line branch 46 respectively making contact with the two semiconductor chips in one of the two pairs 13, 14. In particular, the line branches 46 that come from the branch node 16*a*, first of all make contact with the two semiconductor chips 2, 4, and end at contact connections 18 on the semiconductor chips 3, 5.

In addition, a second conductor track 37 is shown whose branch node 16*b* is likewise arranged in the region of the base area of the first semiconductor chip 1 and whose line branches 47 come from the branch node 16*b* and first of all make contact with the two semiconductor chips 3; 5 and end at contact connections 18 on the two semiconductor chips 2; 4. Within the second group II too, there are, therefore, preferably both first and second conductor tracks 36, 37 provided that run past one another in parallel in the region between the two semiconductor chips 2 and 3 or 4 and 5, respectively, in the pairs 13, 14, in each case coming from opposite directions, and in so doing engaging one another in combed fashion. This is the case at least in regions between the contact connections 18 of the semiconductor chip 2 and the contact connections 18 of the semiconductor chip 3, and likewise between those contact connections 18 on the semiconductor chips 4 and 5. As a result, the line branches 46, 47 in the respective first conductor tracks 36 and second conductor tracks 37 likewise engage in one another like the line branches within the first group I of semiconductor chips, and thereby prevent crosstalk from electrical signals on adjacent lines. Again for the sake of clarity, FIG. 2 respectively shows just a single first conductor track 36 and second conductor track 37 in the line bus L2; however, each of these lines represents a plurality from a plurality of conductor tracks, for example the same number thereof (for example 14), which branch in the same way as shown in FIG. 2 but actuate different ones from the plurality of contact connections 18 on each chip (cf. the semiconductor chip 4 in FIG. 1).

The lines 15 in the line buses L1, L2 are preferably control lines CMD and address lines ADR; however, these line buses may also comprise further lines. Furthermore, FIG. 2 shows a chip 35 which may be a register, for example. However, the line buses L1, L2 do not necessarily need to come from a register, and the inventive memory module 10 does not necessarily need to be a memory module buffered by a register. In any case, the chip 35 is not of the same design as the semiconductor chips 1, 2, . . . , 9; these semiconductor chips of the same design are preferably DRAMs, one of which can be used as an ECC chip for error correction.

Figure 3:
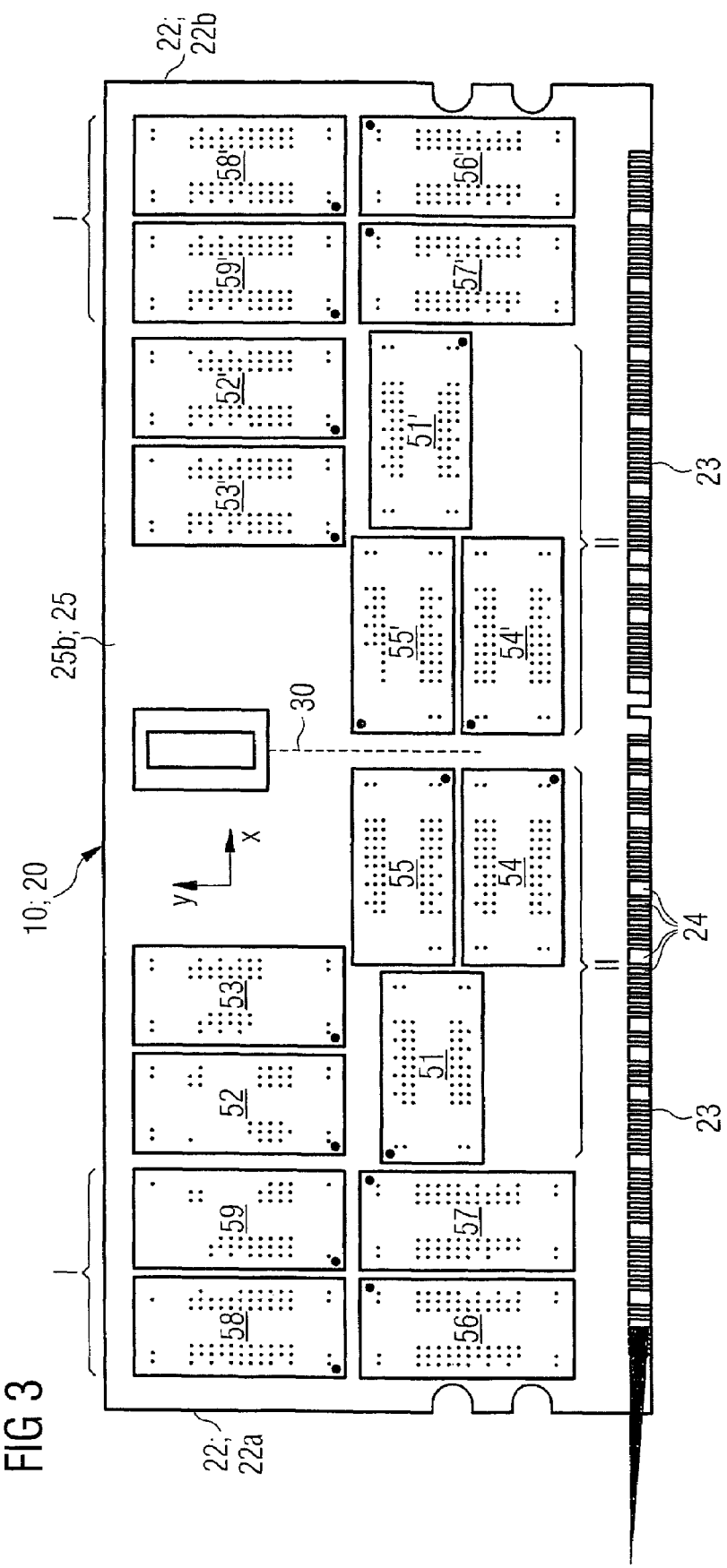
FIG. 3 shows a schematic plan view of a back outer face of a memory module based on the invention in line with one development.

FIG. 3 shows a schematic plan view of a further outer face 25, namely the back outer face 25*b* of the inventive memory module 10. As FIG. 3 shows, the back outer face 25*b* also has identical, further semiconductor chips 51, 52, . . . , 59, 51', 52', . . . , 59' of the same design fitted on it, with the positions of the semiconductor chips on the back outer face 25*b* in a first direction x and a second lateral direction y corresponding to the positions that the semiconductor chips 1, . . . , 9, 1', . . . , 9' take up on the front outer face. The back of the printed circuit board 20 with components fitted on both sides is also provided with a connector strip 23 having a multiplicity of contacts 24 (DIMM; dual in-line memory module). In the same way as in FIG. 1, the back outer face 25b shown in FIG. 3 also has a respective first group I of four semiconductor chips 56, 57, 58, 59 and 56', 57', 58', 59', respectively, and also a second group of five semiconductor chips 51, . . . , 55 and 51', . . . , 55', respectively, provided on it on both sides of the center 30 of the printed circuit board 20. In this case, each first group I is actuated by a dedicated line bus L1 (as in FIG. 2) and each second group II of semiconductor chips is actuated by a dedicated line bus L2 (as in FIG. 2). This makes it possible to achieve a higher storage capacity for the inventive memory module, for example four gigabytes. In particular, however, semiconductor chips of the same design can be arranged in uneven number on any half-area of each outer face 25a or 25b, and connected up to one another, such that reliable, disturbance-free signal forwarding to the semiconductor chips is achieved. Particularly the use of two separate line buses L1, L2 on each half of a printed circuit board or each half of a printed circuit board outer face reduces propagation time differences between the semiconductor chips connected to the same line bus to a minimum. In addition, eighteen respective semiconductor chips of the same design per outer face of the printed circuit board can be arranged next to one another without their uneven dimensions a, b and the large number of semiconductor chips simultaneously arranged next to one another adversely affecting fault-free actuation. The inventive memory module may be a register-controlled module (RDIMM; registered DIMM), for example. Apart from the semiconductor chips of the same design and the register, it may also have a synchronization unit (PLL; phase-locked loop). This chip distributes a clock signal to all the semiconductor memory chips and to the register chip(s). This assists synchronized forwarding of control and address commands to the semiconductor chips.

Figure 4:
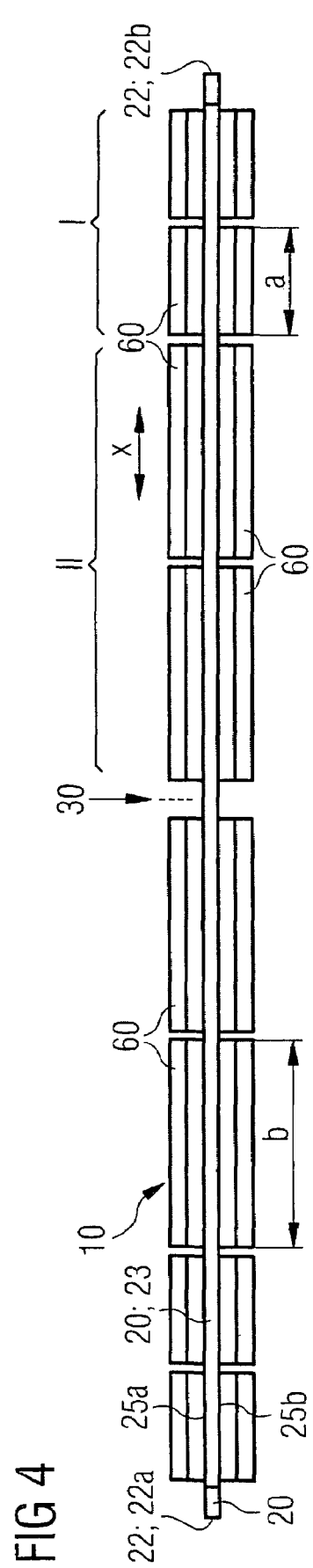
FIG. 4 shows a cross-sectional view of a developed memory module based on the invention.

FIG. 4 shows a cross-sectional view of a developed memory module 10 based on the invention, seen from the direction of the connector strip 23. FIG. 4 shows that semiconductor chips are arranged both on the front outer face 25a and on the back outer face 25b and have further semiconductor chips 60 fitted on them too. By way of example, precisely one semiconductor chip 60 can be fitted over each of the semiconductor chips mounted on the printed circuit board 20. This embodiment is shown in FIG. 4. Alternatively, however, a plurality of semiconductor chips may also be stacked above one another, for example four semiconductor chips above one another per outer face 25a or 25b of the printed circuit board 20. This allows the capacity of the memory module to be increased even further. FIG. 4 shows that the front and back semiconductor chips are arranged in different orientations on the printed circuit board 20. These orientations correspond to the orientations of the semiconductor chips in the respective first group I and second group II, which are shown in FIGS. 1, 2 and 3. The different orientations can be seen in FIG. 4 from the fact that, viewed from the direction of the connector strip 23, the cross sections through the semiconductor chips have a width of a, that is to say the smaller dimension of the semiconductor chips, and in some cases also the width b, corresponding to the larger dimension of the semiconductor chips.

Finally, FIG. 5 shows a further-enlarged detail view from FIG. 2 in which just the two semiconductor chips 8, 9 in the second pair 12 in the first group I of semiconductor chips are shown within a smaller detail from the outer face 25a of the printed circuit board 20. FIG. 5 illustrates how the line branches 17a, 17b in a respective plurality of first conductor tracks 26 and second conductor tracks 27 are arranged in the region between the semiconductor chips 2, 3 so as to engage in one another in combed fashion. Each line branch 17a comes from the branch node and is first of all connected to the contact connection 18 on the first semiconductor chip 8 and ends at a contact connection 18 on the second semiconductor chip 9 in the pair 12. This is the other way round for the line branches 17b in the second conductor tracks 27. The branch points 16 in the respective first and second conductor tracks 26, 27 are shown below the two semiconductor chips 8, 9. The semiconductor chips in the first pair in the first group of semiconductor chips are not shown in FIG. 5 for the sake of clarity; however, further line branches (pointing downward in FIG. 5) in the conductor tracks 26, 27 are routed to them. In FIG. 5, the signal propagation directions of signals that propagate from the branch points 16 in the conductor tracks 26, 27 to the line ends of the line branches 17a, 17b are shown by arrows. It is possible to see that the signals propagate in the direction of the positive x axis along the line branches 17a in the first conductor tracks 26, whereas the signals in the line branches 17b in the second conductor tracks 27 propagate along the negative x axis. Since the line branches 17a, 17b are arranged in alternating sequence in the region between the two semiconductor chips 8, 9, crosstalk problems and signal distortions caused thereby are almost prevented. In the same way, the line branches in respective first and second conductor tracks engage in one another in combed fashion in the region between the semiconductor chips 6, 7 in the first pair 11 in the first group I (FIG. 1) and in the region between the two semiconductor chips 2, 3 in the first pair 13 in the second group II and in the region between the two semiconductor chips 4, 5 in the second pair 14 in the second group II of semiconductor chips.

The inventive memory module, therefore, not only allows matching of signal propagation times and conductor track lengths but also reduces the signal distortion in control and address signals that are routed to or received from the semiconductor chips along conductor tracks that are adjacent to one another.

What is claimed is:

1. A memory module comprising an electronic printed circuit board and a plurality of semiconductor chips of the same type that are mounted on at least one outer face of the printed circuit board, wherein the printed circuit board has a connector strip, which runs at a first edge of the at least one outer face a first direction and has a multiplicity of electrical contacts that are lined up in the first direction, wherein the printed circuit board extends in the first direction between two second edges, wherein at least nine of the semiconductor chips of the same type are respectively mounted next to one another on the at least one outer face of the printed circuit board between the center of the printed circuit board and the respective second edge of the printed circuit board, wherein the at least nine of the semiconductor chips of the same type respectively have a smaller dimension and, in a direction perpendicular to the smaller dimension, a larger dimension which is larger than the smaller dimension, wherein a respective first group of four of the semiconductor chips of the same type, which are oriented so as to have their shorter dimension parallel to the connector strip, is arranged at the respective second edge of the printed circuit board, wherein a second group of five of the semiconductor chips of the same type is respectively arranged between the first group of semiconductor chips and the center of the printed circuit board, and wherein the first group of semiconductor chips and the second group of semiconductor chips are respectively connected by two separate line buses whose conductor tracks branch toward all the semiconductor chips in the respective group of semiconductor chips.

2. The memory module as claimed in claim 1, wherein the first group of semiconductor chips has a first pair of semiconductor chips, which are arranged in proximity to the connector strip, and a second pair of semiconductor chips, which are arranged at a greater distance from the connector strip than the semiconductor chips in the first pair, where one semiconductor chip in each pair is arranged at the second edge of the printed circuit board, and the respective other semiconductor chip in the respective pair is arranged at a greater distance from the second edge of the printed circuit board.

3. The memory module as claimed in claim 1, wherein each conductor track in the line bus of the first group of semiconductor chips has a branch node that is arranged between the first pair and the second pair of semiconductor chips and from which two respective line branches emerge that respectively make contact with the two semiconductor chips in one of the two pairs of semiconductor chips.

4. The memory module as claimed in claim 3, wherein the line branches are respectively routed away below the base area of one semiconductor chip in the relevant pair and end in the region of the base area of the respective other semiconductor chip in the relevant pair.

5. The memory module as claimed in claim 3, wherein the line bus of the first group of semiconductor chips has at least one first conductor track whose branch node is arranged in the first direction between the two semiconductor chips arranged at the second edge of the printed circuit board and whose line branches end in the region of the base area of the two further semiconductor chips in the first group.

6. The memory module as claimed in claim 3, wherein the line bus for the first group of semiconductor chips has at least one second conductor track whose branch node is arranged in the first direction between the two further semiconductor chips in the first group and whose line branches respectively end in the region of the base area of the semiconductor chips arranged at the second edge.

7. The memory module as claimed in claim 6, wherein the line bus of the first group of semiconductor chips has at least one first conductor track and at least one second conductor track.

8. The memory module as claimed in claim 7, wherein the line bus of the first group of semiconductor chips respectively has the same number of first conductor tracks and second conductor tracks.

9. The memory module as claimed in claims 1, wherein the second group of semiconductor chips respectively has a first semiconductor chip, a first pair of semiconductor chips and a second pair of semiconductor chips, wherein the first semiconductor chip and the semiconductor chips in the second pair are respectively mounted so as to have their larger dimension oriented parallel to the connector strip, and the semiconductor chips in the first pair are mounted so as to have their smaller dimension oriented parallel to the connector strip, wherein the semiconductor chips in the first pair are arranged at a greater distance from the connector strip than the first semiconductor chip and than the semiconductor chips in the second pair, and wherein the first semiconductor chip is arranged between the first group of semiconductor chips and the second pair of semiconductor chips in the second group.

10. The memory module as claimed in claim 9, wherein the semiconductor chips in the first pair in the first group, in the second pair in the first group and in the first pair in the second group of semiconductor chips are respectively mounted so as to be at a distance from one another in the first direction, and wherein the semiconductor chips in the second pair in the second group of semiconductor chips are mounted so as to be at a distance from one another in the direction perpendicular to the first direction.

11. The memory module as claimed in claim 9, wherein the conductor tracks in the line bus in the second group of semiconductor chips respectively have a branch node in the region of the base area of the first semiconductor chip in the second group, from which branch node the first semiconductor chip has contact made with it and from which branch node two respective line branches emerge, with one line branch making contact with the semiconductor chips in the first pair and the other line branch making contact with the semiconductor chips in the second pair.

12. The memory module as claimed in claim 1, wherein the first pair and the second pair of semiconductor chips in the second group of semiconductor chips respectively have a first semiconductor chip and a second semiconductor chip, wherein the first semiconductor chip in the first pair is arranged at a greater distance from the center of the memory module than the second semiconductor chip in the first pair, and wherein the first semiconductor chip in the second pair is arranged closer to the connector strip than the second semiconductor chip in the second pair.

13. The memory module as claimed in claim 12, wherein the line bus in the second group of semiconductor chips has at least one first conductor track from whose branch node two line branches emerge, one line branch of which makes contact with the semiconductor chips in the first pair, and the other line branch of which makes contact with the semiconductor chips in the second pair, wherein the two line branches, starting from the branch node, first of all make contact with the first semiconductor chip in the relevant pair of semiconductor chips and end at contact connections on the second semiconductor chip in the relevant pair.

14. The memory module as claimed in claim 12, wherein the line bus in the second group of semiconductor chips has at least one second conductor track from whose branch node two line branches emerge, one line branch of which makes contact with the semiconductor chips in the first group, and the other line branch of which makes contact with the semiconductor chips in the second group, wherein the two line branches, starting from the branch node, first of all make contact with the second semiconductor chip in the relevant pair of semiconductor chips and end at contact connections on the first semiconductor chip in the relevant pair.

15. The memory module as claimed in claim 14, wherein the line bus of the second group of semiconductor chips has at least one first conductor track and at least one second conductor track.

16. The memory module as claimed in claim 14, wherein the line bus of the second group of semiconductor chips respectively has the same amount of first conductor tracks and second conductor tracks.

17. The memory module. as claimed in claim 1, wherein the line branches in the first conductor tracks and in the second conductor tracks in the line bus of the first group of semiconductor chips are arranged, starting from their respective branch node as far as their ends of line, such that the line branches in the first conductor tracks run in opposite directions parallel to the line branches in the second conductor tracks between the two semiconductor chips in the relevant pair of semiconductor chips in the first group.

18. The memory module as claimed in claim 1, wherein the line branches in the first conductor tracks in the line bus of the first group of semiconductor chips are arranged so as to engage in combed fashion with the line branches in the second conductor tracks in the line bus of the first group of semiconductor chips.

19. The memory module as claimed in claim 1, wherein the line branches in the first conductor tracks and in the second conductor tracks in the line bus of the second group of semiconductor chips are arranged, starting from their respective branch nodes as far as their ends of line, such that the line branches in the first conductor tracks run in opposite directions parallel to the line branches in the second conductor tracks between the two semiconductor chips in the relevant pair of semiconductor chips in the second group.

20. The memory module as claimed in claim 1, wherein the line branches in the first conductor tracks in the line bus of the second group of semiconductor chips are arranged so as to engage in combed fashion with the line branches in the second conductor tracks in the line bus of the second group of semiconductor chips.

21. The memory module as claimed in claim 1, wherein the memory module has at least eighteen semiconductor chips of the same type on the at least one outer face of the printed circuit board between the two second edges, among which nine of the semiconductor chips of the same type are provided between the center of the memory module and one second edge and are arranged in mirror-inverted fashion relative to the center of the memory module in relation to a further nine of the semiconductor chips of the same type which are arranged between the center of the memory module and the other second edge.

22. The memory module as claimed in claims 21, wherein the memory module has a front outer face and a back outer face, with the back outer face having at least a further eighteen semiconductor chips of the same type provided on it whose positions on the back outer face of the printed circuit board correspond to the positions of the semiconductor chips on the front outer face of the printed circuit board.

23. The memory module as claimed in claims 1, wherein the memory module has further semiconductor chips of the same type that are fitted on the semiconductor chips mounted on the printed circuit board and are actuated via the same respective conductor tracks as the semiconductor chips mounted on the printed circuit board.

24. The memory module as claimed in claim 1, wherein the conductor tracks in the line buses, that make contact with the semiconductor chips, are control lines and address lines.

25. The memory module as claimed in claim 1, wherein the conductor tracks in each line bus of a first group of semiconductor chips respectively have an approximately standard length among one another, starting from an input end of the line bus as far as the respective ends of line connected to chip contact connections, and wherein the conductor tracks in each line bus of a second group of semiconductor chips have a respective different standard length among one another, starting from an input end of the line bus as far as the respective ends of line connected to chip contact connections.

26. The memory module as claimed in claim 25, wherein the standard length of the conductor tracks in each line bus of a first group of semiconductor chips is greater than the standard length of the conductor tracks in each line bus of a second group of semiconductor chips.

27. The memory module as claimed in claim 25, wherein the conductor tracks in the line buses are respectively designed to start from an input end of the line buses that is arranged in the center of the memory module.

28. The memory module as claimed in claim 27, wherein the respective input ends of line of the conductor tracks in the line buses are respectively connected to a register.

29. The memory module as claimed in claim 28, wherein the semiconductor chips of the same type are dynamic read/write memory chips.

\* \* \* \* \*